(12) United States Patent
Yoshida et al.

(10) Patent No.: US 6,615,384 B1
(45) Date of Patent: Sep. 2, 2003

(54) ENCODING/DECODING METHOD AND APPARATUS AND DISK STORAGE DEVICE

(75) Inventors: Kenji Yoshida, Akishima (JP); Koichi Nishide, Tachikawa (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/388,967

(22) Filed: Sep. 2, 1999

(30) Foreign Application Priority Data

Jan. 14, 1999 (JP) .......................................... 11-008132

(51) Int. Cl.⁷ ............................................. H03M 13/00
(52) U.S. Cl. ...................... 714/755; 714/762; 714/746; 714/752
(58) Field of Search ................................ 714/755, 746, 714/752, 756, 701, 762

(56) References Cited

U.S. PATENT DOCUMENTS 4,355,392 A * 10/1982 Doi et al.
4,546,474 A * 10/1985 Sako et al.
5,140,596 A * 8/1992 Weldon, Jr.
5,392,299 A * 2/1995 Rhines et al.
5,642,365 A * 6/1997 Murakami .................. 714/761
6,023,783 A * 2/2000 Divsalar et al.
6,334,197 B1 * 12/2001 Eroz et al.

* cited by examiner

Primary Examiner—Phung M. Chung
(74) Attorney, Agent, or Firm—Gray Cary Ware & Freidenrich LLP

(57) ABSTRACT

An encoding/decoding apparatus generates data sequences with first and second interleave structures by respectively performing data on a data sequence to be encoded, interleaving processes based on different first and second data interleaving schemes, generates sequences of first and second error correcting codes respectively corresponding to the data sequences with the first and second interleave structures, and generates an encoded data sequence which has the generated sequences of first and second error correcting codes affixed to the data sequence to be encoded. The encoding/decoding apparatus decodes a data sequence to be decoded, included in the encoded data sequence, by using the data interleaving processes and the sequences of first and second error correcting codes.

21 Claims, 7 Drawing Sheets

| DATA SEQUENCE | ECC |
|---|---|
| DATA SEQUENCE | ECC |
| DATA SEQUENCE | ECC |
FIG. 1A (PRIOR ART)
| DATA SEQUENCE | ECC |
|---|---|
| DATA SEQUENCE | ECC |
| DATA SEQUENCE | ECC |
| ECC | |
FIG. 1C (PRIOR ART)
| DATA SEQUENCE | ECC |
|---|---|
| DATA SEQUENCE | ECC |
| DATA SEQUENCE | ECC |
FIG. 1B (PRIOR ART)
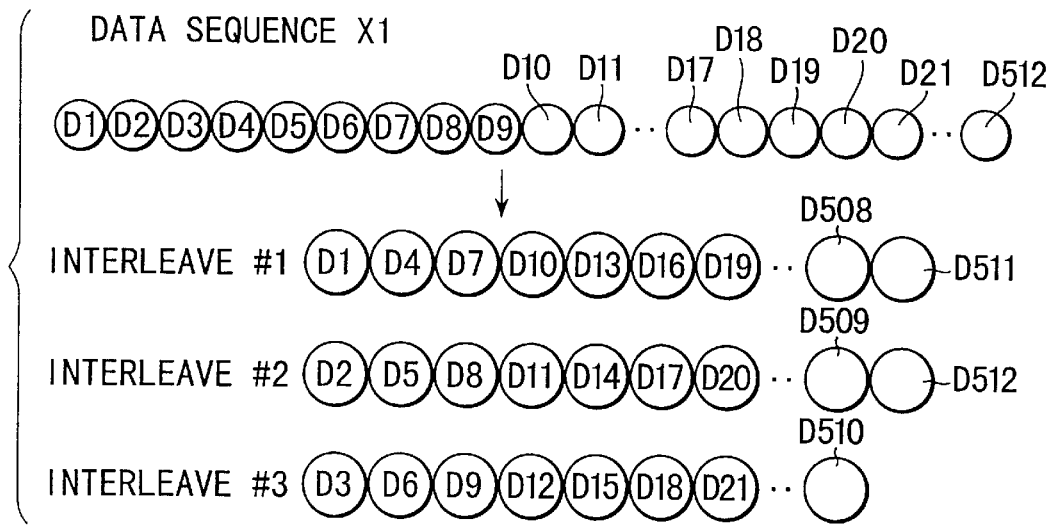
FIG. 3
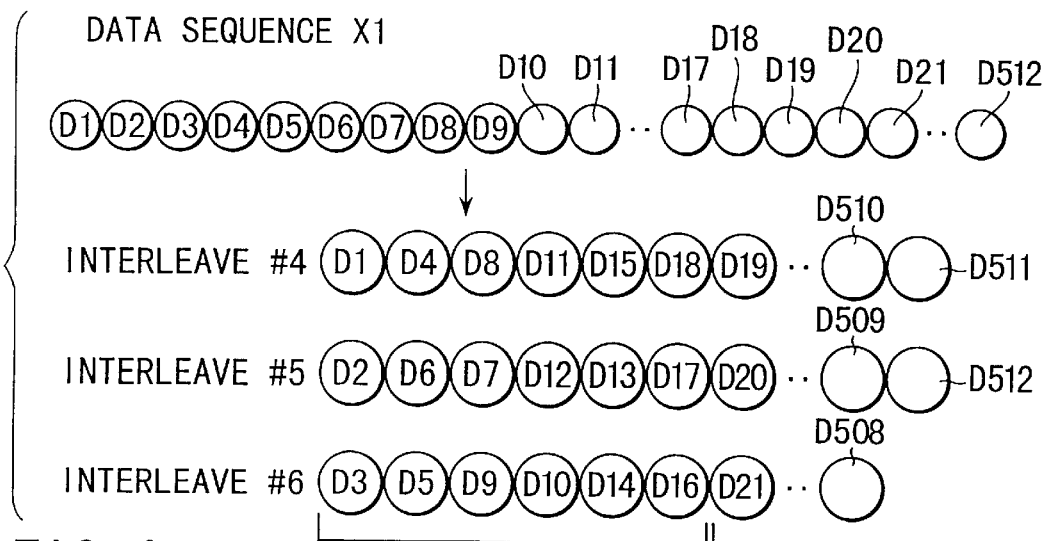
FIG. 4

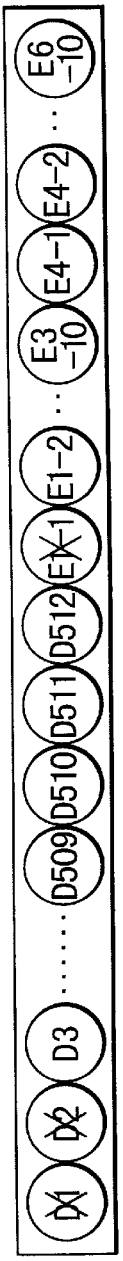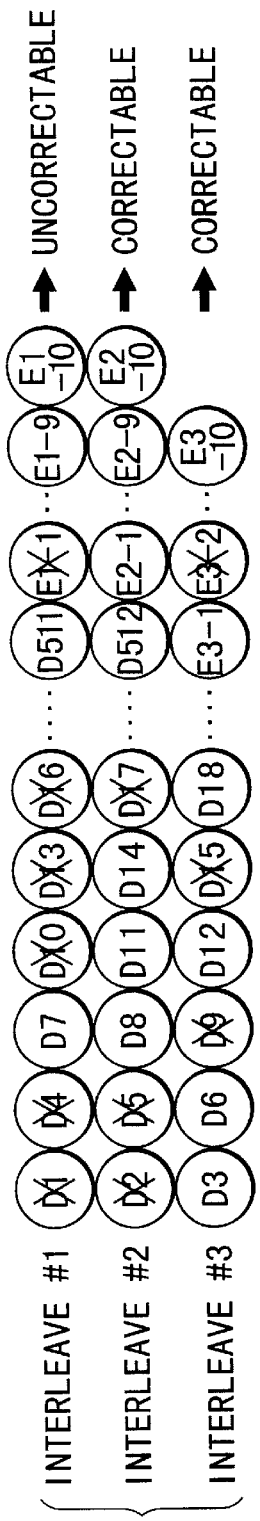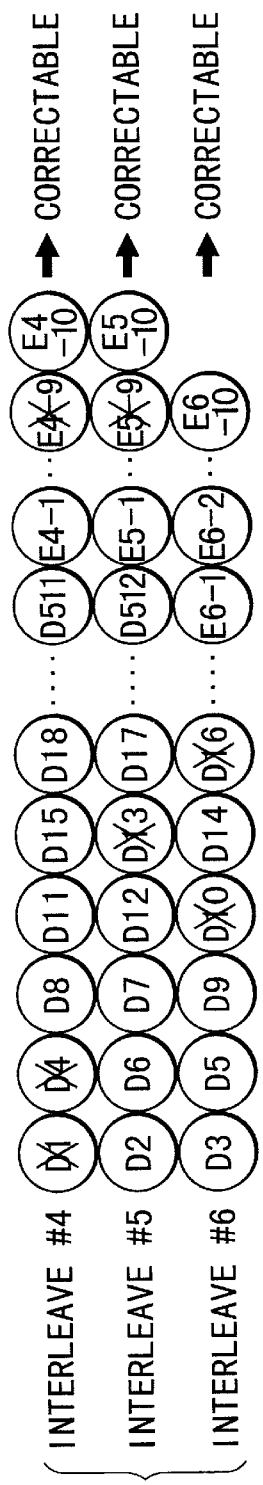
FIG. 8A
FIG. 8B
FIG. 8C

ENCODING/DECODING METHOD AND APPARATUS AND DISK STORAGE DEVICE

BACKGROUND OF THE INVENTION

The present invention relates to an encoding/decoding method and apparatus, and a disk storage device, which all perform error correction on a data sequence to be recorded or transferred.

The encoding/decoding (communication channel encoding) technique that is necessary for error correction to guarantee the reliability of data is one of very important elements in a disk storage device like a hard disk drive (HDD), and a data communication system. This has therefore encouraged development and proposal of various kinds of encoding/decoding systems.

"Encoding" here means a process of generating a sequence of encoded data or code words by affixing redundancy data (ECC (Error Correcting Code) like a check symbol) to a data sequence (consisting of a sequence of bits of 0 and 1) which indicates digital information. "Decoding" is a process of performing error correction (including error detection) on a received (input) encoded data sequence or code word sequence to estimate the original data sequence or inform presence/absence of errors. The types of data errors are a random error which occurs at random for each bit, and a burst error which is a series of errors.

With regard to an HDD, for example, there may be a composite error communication channel in which a random error and a burst error may both occur. A "communication channel" in the error correcting encoding scheme means a model system which includes a read/write circuit (signal processing circuit) called a read/write channel, and a disk storage medium. One error correcting system that is used for this composite error communication channel is a system which implements a data interleaving process on a data sequence or a sequence of recorded data and uses a random error correcting code or a block code, such as an RS (Reed-Solomon) code, on a data sequence with an interleave structure that has been produced by the data interleaving process (which may simply referred to as "interleaved data sequence"). For the sake of convenience, this system is called "first encoding system."

There is another error correcting system which arranges data and generates check symbols CS in two directions in the arrangement. One example of the system is an encoding system (product code) which arranges data in a two dimensional matrix and encodes each row of data and each column of data. As a "check symbol" is one kind of ECC, a check symbol will be used as a synonym for "ECC."

Conceptually, the first encoding system generates a sequence of encoded data which has resulted from affixing an ECC (check symbol) to each of three interleaved data sequences as shown in FIG. 1A. While the first encoding system can advantageously be realized by a circuit with a relatively simple structure, it has such a drawback as to be unable to correct data when errors are concentrated on one interleaved data sequence.

As a solution to this shortcoming, one may consider a system which increases the number of check symbols in order to increase the number of correctable errors for each interleaved data sequence as shown in FIG. 1B. (For the sake of convenience, this system is called "second encoding system.") The second encoding system however requires a greater time for error correction (decoding process) regardless of the number of errors.

In view of the above, a third encoding system has been proposed which employs the aforementioned product code or cross-interleaving scheme, as shown in FIG. 1C. The third encoding system generates a check symbol for each row of an interleaved data sequence which is acquired by the data interleaving process, and also generates a check symbol for each column (or data in a different direction from row, such as an oblique direction).

This third encoding system can increase the number of correctable errors for each interleaved data sequence and can decode errors correctable by the first encoding system in the same processing speed. As compared with the first encoding system, however, the number of check symbols is increased by the number of check symbols used in the column direction. This results in an increase in the number of check symbols to be affixed to a data sequence to be recorded, thus lowering the encoding efficiency.

BRIEF SUMMARY OF THE INVENTION

Accordingly, it is an object of the present invention to provide an encoding/decoding method and apparatus, and a disk storage device, which can suppress reduction in the encoding efficiency by using a relatively small amount of error correcting codes and can ensure fast and reliable decoding.

According to one aspect of the present invention, there is provided an encoding/decoding apparatus comprising: means for generating data sequences with first and second interleave structures by respectively performing on a data sequence to be encoded, data interleaving processes based on different first and second data interleaving schemes; means for generating sequences of first and second error correcting codes respectively corresponding to the data sequences with the first and second interleave structures; means for generating an encoded data sequence which has the generated sequences of first and second error correcting codes affixed to the data sequence to be encoded; and means for decoding a data sequence to be decoded, included in the encoded data sequence, by using the data interleaving processes and the sequences of first and second error correcting codes.

According to another aspect of the present invention, there is provided a disk storage device comprising: means for generating data sequences with first and second interleave structures by respectively performing on a data sequence to be written on a disk storage medium, data interleaving processes based on different first and second data interleaving schemes; means for generating sequences of first and second error correcting codes respectively corresponding to the data sequences with the first and second interleave structures; means for generating an encoded data sequence which has the generated sequences of first and second error correcting codes affixed to the data sequence to be written on the disk storage medium; means for writing the generated, encoded data sequence on the disk storage medium; means for reading the encoded data sequence written on the disk storage medium; and means for decoding a data sequence to be transferred, included in the read, encoded data sequence, by using the data interleaving processes and the sequences of first and second error correcting codes.

According to still another aspect of the present invention, there is provided an encoding method comprising the steps of: generating data sequences with first and second interleave structures by respectively performing on a data sequence to be encoded, data interleaving processes based on different first and second data interleaving schemes; generating sequences of first and second error correcting codes respectively corresponding to the data sequences with the first and second interleave structures; and generating an encoded data sequence which has the generated sequences of first and second error correcting codes affixed to the data sequence to be encoded.

According to still another aspect of the present invention, there is provided a decoding method comprising the steps of: reproducing a data sequence with a first interleave structure by performing on a data sequence which is to be decoded and included in an encoded data sequence, a data interleaving process based on a first data interleaving scheme; executing a first error correcting process on the reproduced data sequence with the first interleave structure, by using a sequence of first error correcting codes included in the encoded data sequence; reproducing a data sequence with a second interleave structure by performing on the data sequence to be decoded, a data interleaving process based on a second data interleaving scheme; executing a second error correcting process on the reproducing data sequence with the second interleave structure, by using a sequence of second error correcting codes included in the encoded data sequence; and alternately performing the first error correcting process and the second error correcting process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention in which:

FIGS. 1A through 1C are conceptual diagrams for explaining conventional error correcting systems;

FIG. 3 is a conceptual diagram for explaining a first data interleaving scheme according to this embodiment;

FIG. 4 is a conceptual diagram for explaining a second data interleaving scheme according to this embodiment;

FIGS. 8A to 8C are conceptual diagrams for explaining the decoding process according to this embodiment.

DETAILED DESCRIPTION OF THE INVENTION

Preferred embodiments of the present invention will now be described with reference to the accompanying drawings.

First Embodiment

System Structure

Figure 2:
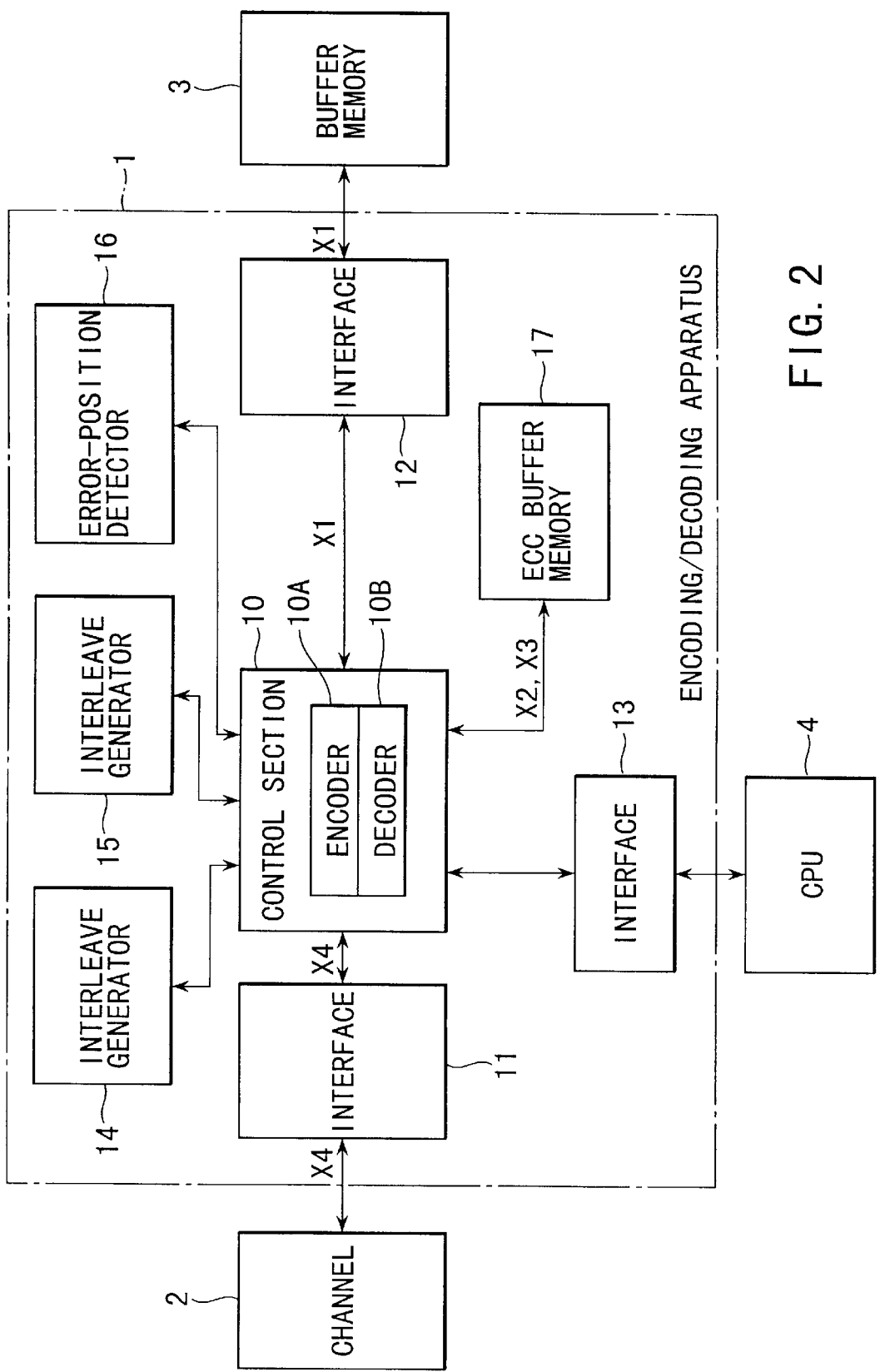
FIG. 2 is a block diagram illustrating the structure of an encoding/decoding apparatus according to a first embodiment of the present invention.

FIG. 2 presents a functional block diagram functionally illustrating the structure of an encoding/decoding apparatus according to a first embodiment of this invention.

An encoding/decoding apparatus 1 of this embodiment is adapted for use for a composite error communication channel (channel 2) on the assumption that it implements an encoding/decoding process on a data sequence between an external buffer memory 3 and the channel 2. An example of application of this invention to an HDD will be discussed specifically in a later section of a second embodiment.

As shown in FIG. 2, the encoding/decoding apparatus 1 has a control section 10 including an encoder 10A and a decoder 10B, interfaces 11, 12 and 13, a first interleave generator 14 for executing a first data interleaving process, a second interleave generator 15 for executing a second data interleaving process, an error-position detector 16 and an ECC buffer memory 17.

The control section 10 receives a data sequence X1 to be processed from the external buffer memory 3 via the interface 12. The control section 10 sends an encoded data sequence X4, which is acquired by encoding the data sequence X1 by means of the encoder 10A (i.e., which is acquired by affixing check symbols to the data sequence X1), to the external channel 2 via the interface 11. In this encoding process, the control section 10 stores the check symbols (i.e., ECC data sequences X2 and X3) into the ECC buffer memory 17.

The control section 10 receives a data sequence X4 to be decoded, from the channel 2 via the interface 11, and performs a decoding process with error correction by means of the decoder 10B. The control section 10 sends a decoded data sequence X1 to the buffer memory 3 via the interface 12. The control section 10 exchanges control information on the encoding/decoding process (e.g., a process for uncorrectable errors) with an external CPU 4 via the interface 13.

Encoding Process

Referring to FIGS. 2 to 4, an error correcting coding process according to this embodiment will now be described using flowcharts in FIGS. 5 and 6.

Figure 6:
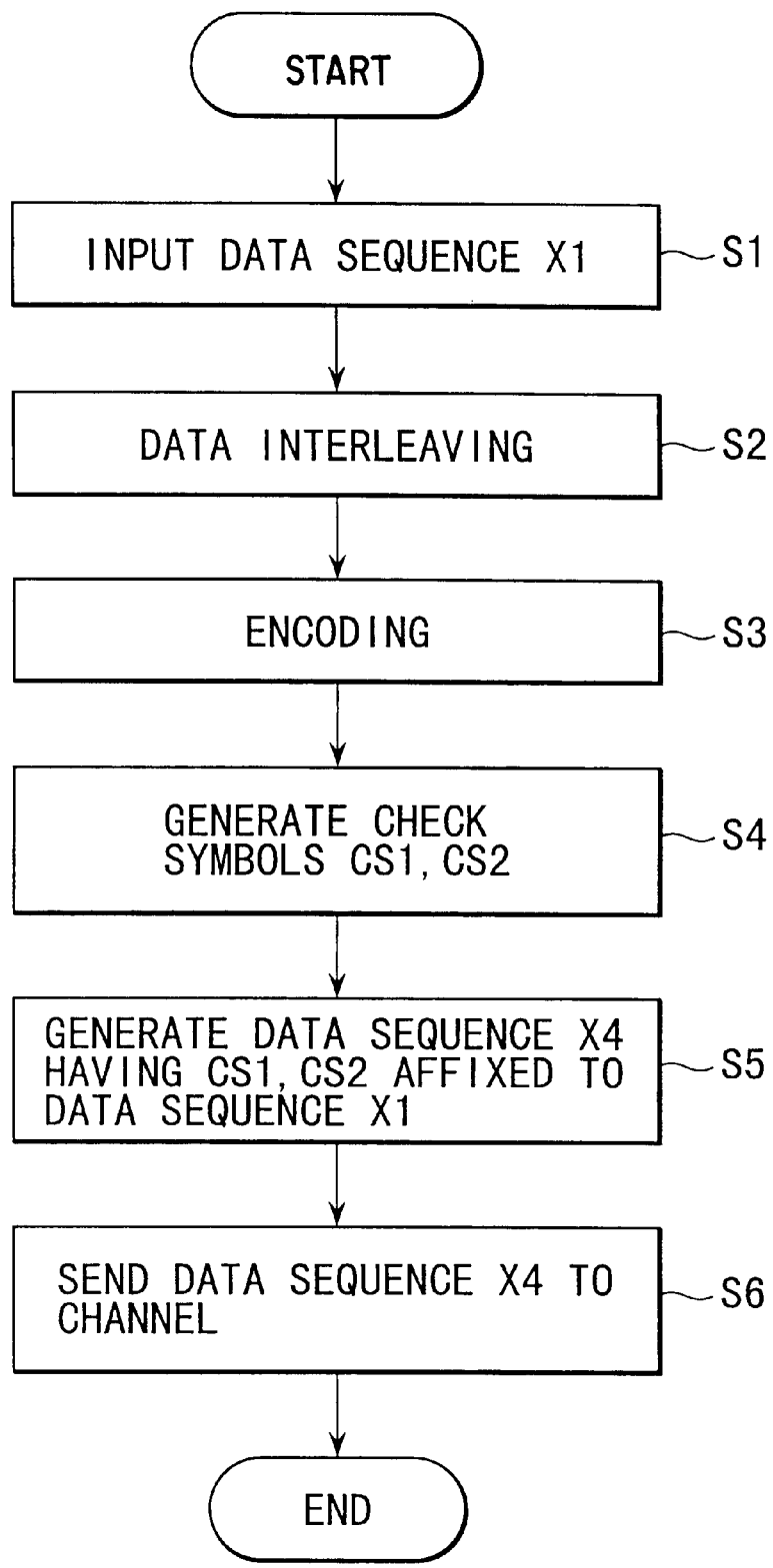
FIG. 6 is a flowchart for explaining the encoding process according to this embodiment.
Figure 7:
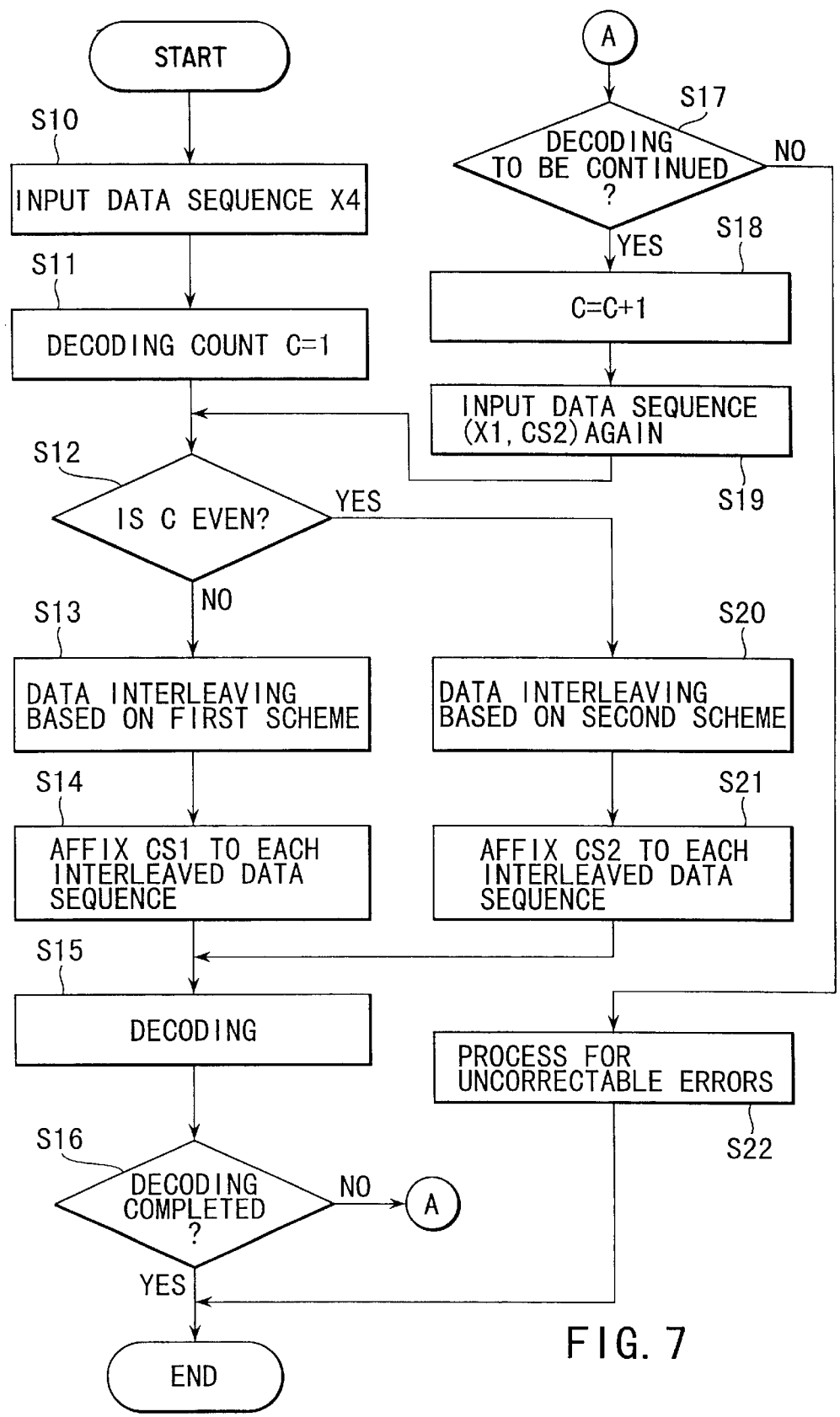
FIG. 7 is a flowchart for explaining a decoding process according to this embodiment.

First, the control section 10 receives the data sequence X1 to be processed from the external buffer memory 3 via the interface 12 (step S1 in FIG. 6). It is assumed that the data sequence X1 is a data sequence (data D1 to D512) of 512 bytes as an information block unit.

The control section 10 causes the first interleave generator 14 to implement the first data interleaving process on the data sequence X1 and causes the second interleave generator 15 to implement the second data interleaving process on the data sequence X1, (step S2).

Specifically, in a case where there are "three" interleaved data sequences, as shown in FIG. 3, the first interleave generator 14 executes the first data interleaving scheme of distributing the data D1 to D512 (each corresponding to a bit indicating either 0 or 1) that constitutes the data sequence X1 to an interleaved data sequence #1, interleaved data sequence #2 and interleaved data sequence #3 data by data.

For "three" interleaved data sequences, the second interleave generator 15 executes the second data interleaving scheme of sequentially separating the data D1 to D512 constituting the data sequence X1 into groups of three pieces of data and then distributing each group of data to an interleaved data sequence #4, interleaved data sequence #5 and interleaved data sequence #6, as shown in FIG. 4. It is to be noted that the first data interleaving scheme differs from the second data interleaving scheme in how to distribute the data D1–D512.

There are six (3!=3×2×1=6) possible ways (orders) of distributing the aforementioned separated group of three pieces of data into the interleaved data sequence #4, interleaved data sequence #5 and interleaved data sequence #6. At the time of distributing the data D1–D512 into the interleaved data sequence #4, interleaved data sequence #5 and interleaved data sequence #6, therefore, every one of the six distributing ways for three pieces of data is used in a predetermined order. In the example in FIG. 4, all the six distributing ways are used when distribution of the data D1–D18 is completed, and the same six distributing ways will be used again for distribution of the next eighteen pieces of data starting at D19.

Figure 5:
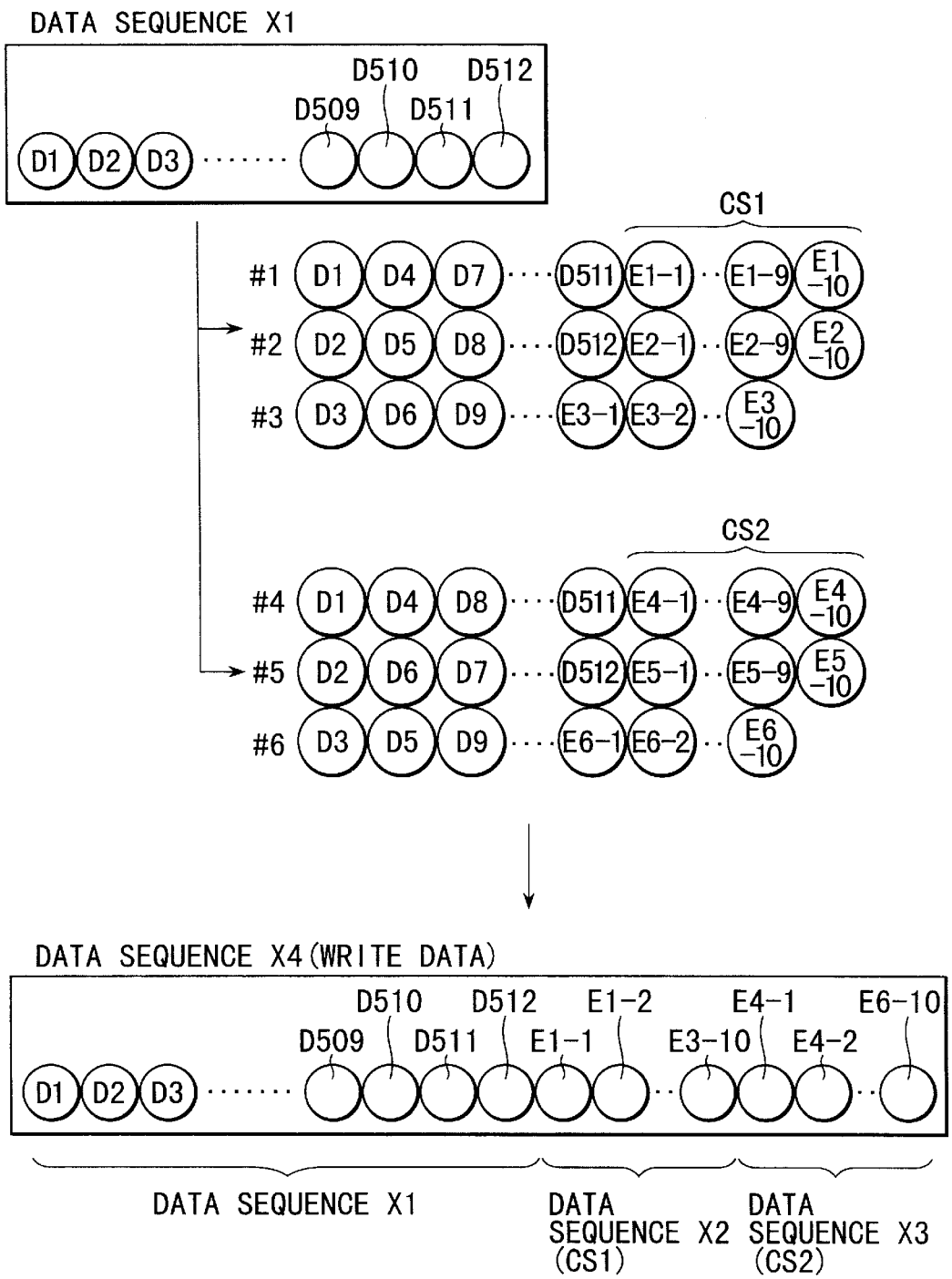
FIG. 5 is a conceptual diagram for explaining a way of generating check symbols and an encoding process according to this embodiment.

Those data interleaving processes allow the 512-byte data sequence X1 consisting of the data D1–D512 to be distributed as shown on the upper left side of FIG. 5.

Specifically, the first data interleaving scheme distributes the data D1–D512 into the interleaved data sequence #1 consisting of the data D1, D4, D7, ..., and D511, the interleaved data sequence #2 consisting of the data D2, D5, D8, ..., and D512, and the interleaved data sequence #3 consisting of the data D3, D6, D9, and D510.

The second data interleaving scheme distributes the data D1–D512 into the interleaved data sequence #4 consisting of the data D1, D4, DB, ..., and D512, the interleaved data sequence #5 consisting of the data D2, D6, D7, ..., and D511, and the interleaved data sequence #6 consisting of the data D3, D5, D9, and D508.

Next, the control section 10 causes the encoder 10A to execute an encoding process of generating the following check symbols (ECC data) (step S3 in FIG. 6).

This encoding process generates a sequence of check symbols (error correcting codes) CS1 and a sequence of check symbols CS2, which are respectively associated with the interleaved data sequences #1 to #3 and the interleaved data sequences #4 to #6, as shown on the upper right side in FIG. 5 (step S4).

More specifically, the encoding process generates a check symbol sequence consisting of error correcting codes E1-1, E1-2, ..., and E1-10 for the interleaved data sequence #1. Note that the number of bytes of a check symbol is determined by the desired error correcting performance. This example is given on the assumption that a check symbol sequence of 10 bytes per interleaved data sequence is generated. A check symbol sequence consisting of error correcting codes E2-1, E2-2, ..., and E2-10 is generated for the interleaved data sequence #2, and a check symbol sequence consisting of error correcting codes E3-1, E3-2, ... and E3-10 for the interleaved data sequence #3.

The error correcting codes E1-1, E1-2, ..., and E1-10, E2-1, E2-2, ..., and E2-10, and E3-1, E3-2, and E3-10 that have been acquired by the encoding process correspond to the check symbol sequence CS1 (data sequence X2).

The encoding process also generates a check symbol sequence consisting of error correcting codes E4-1, E4-2, ..., and E4-10 for the interleaved data sequence #4. The encoding process further generates a check symbol sequence consisting of error correcting codes E5-1, E5-2, ..., and E5-10 for the interleaved data sequence #5, and a check symbol sequence consisting of error correcting codes E6-1, E6-2, ..., and E6-10 for the interleaved data sequence #6.

The error correcting codes E4-1, E4-2, ..., and E4-10, E5-1, E5-2, ..., and E5-10, and E6-1, E6-2, ... and E6-10 that have been acquired by the encoding process correspond to the check symbol sequence CS2 (data sequence X3).

Although the number of bytes of check symbols to be generated is the same for all the interleaved data sequences obtained by the first data interleaving scheme and the second data interleaving scheme, the number of bytes may be varied.

The control section 10 affixes the check symbol sequence CS1 and check symbol sequence CS2, generated by the above-described processing, to the data sequence X1 of 512 bytes, as the data sequences X2 and X3, respectively, thereby generating an encoded data sequence X4 (corresponding to write data in the case of an HDD) (step S5).

Then, the control section 10 sends the encoded data sequence X4 to the channel 2 (step S6).

In the actual structure, the encoded data sequence X4 may be subjected to data compression before being sent out, or may further be undergone a data interleaving process to rearrange the order of the data before it is sent out.

Decoding Process

A decoding process according to this embodiment will now be described with reference to a flowchart in FIG. 7 and FIGS. 8A to 8C.

To begin with, the control section 10 receives an encoded data sequence X4 to be decoded, which has been transferred from the channel 2 via the interface 11 (step S10).

It is assumed that this data sequence X4, which consists of the original data sequence X1, the check symbol sequence CS1 and the check symbol sequence CS2, contains error data (error bits) D1, D2 and E1-1 (see FIG. 8A).

The control section 10 in this embodiment counts the number of decoding that has been performed so far (decoding count C) and performs a decoding process according to the count value.

Since the decoding count C is "1" and an odd number in the first data transfer, the control section 10 causes the decoder 10B to execute a decoding process using the data sequence X1 and the check symbol sequence CS1 (NO in step S12 and S13). Specifically, the decoder 10B implements the first data interleaving process on the data sequence X1 and converts X1 into three interleaved data sequences #1, #2 and #3.

Then, as shown in FIG. 8B, the error correcting codes E1-1, E1-2, ..., and E1-10 corresponding to the check symbol sequence CS1 are affixed to the interleaved data sequence #1, the error correcting codes E2-1, E2-2, ..., and E2-10 are affixed to the interleaved data sequence #2, and the error correcting codes E3-1, E3-2, ..., and E3-10 are affixed to the interleaved data sequence #3 (step S14).

The control section 10 causes the decoder 10B to decode the individual interleaved data sequences (including check symbols), acquired through the above processing, to check if there is any error data. When there is an error which is correctable, the control section 10 causes the error-position detector 16 to compute the value and positional information of that error and corrects the error data at the computed position (step S15).

The control section 10 sends (saves) each data whose error has been corrected in the decoding process to the buffer memory 3. Accordingly, the corrected data is reflected on the buffer memory 3 where the amount of error data is reduced.

When decoding of the three interleaved data sequences is finished, the control section 10 determines if error data in every interleaved data sequence has been corrected properly, and terminates the decoding process if it decides that error correction has been completed for all the interleaved data sequences (step S16).

If there is any uncorrectable interleaved data sequence, the control section 10 determines whether or not to execute error correction again using other check symbols (step S17).

In a case of continuing the decoding process or error correction, the control section 10 increments the decoding count C and executes the decoding process again steps S18 and S19).

In the second decoding process, as the decoding count C is "2" and an even number, the control section 10 causes the decoder 10B to execute decoding using the data sequence X1 and the check symbol sequence CS2 (YES in step S12 and S20). Specifically, the decoder 10B implements the second data interleaving process on the data sequence X1 and converts X1 into three interleaved data sequences #4, #5 and #6. At this time, the control section 10 uses data reflected on the buffer memory 3.

Then, as shown in FIG. 8C, the error correcting codes E4-1, E4-2, . . . , and E4-10 corresponding to the check symbol sequence CS2 are affixed to the interleaved data sequence #4, the error correcting codes E5-1, E5-2, . . . , and E5-10 are affixed to the interleaved data sequence #5, and the error correcting codes E6-1, E6-2, . . . , and E6-10 are affixed to the interleaved data sequence #6 (step S21).

Then, the control section 10 performs the same decoding process as done for the first decoding process and executes error correction on those correctable error data (step S15).

When the control section 10 decides that error correction has been completed for all the interleaved data sequences, it terminates the decoding process (step S16).

If there is any uncorrectable interleaved data sequence, the control section 10 executes the decoding process using the first data interleaving scheme and using again the check symbol sequence CS1. If the control section 10 determines based on the value of the decoding count C that error correction cannot be completed, it terminates the decoding process considering the error correction is impossible (step S22). In this case, the control section 10 may inform the external CPU 4 of error correction being impossible via the interface 13.

As a specific example of this embodiment, error correcting encoding which can correct up to 5 bytes per interleaved data sequence, as shown in FIGS. 8B and 8C, is implemented. That is, it is assumed that errors have occurred in the data D1, D2, D4, D5, D9, D10, D13, D15, D16 and D17 in the data sequence X1, and errors have occurred in the error correcting codes E1-1, E3-2, E4-9 and E5-9.

In the first decoding process, the interleaved data sequences #2 and #3 are correctable while the interleaved data sequence #1 contains 6 bytes of errors and is uncorrectable (see FIG. 8B). In the second decoding process, errors that have been determined uncorrectable in the first decoding process are all corrected (see FIG. 8C). Of the six errors that have remained as uncorrectable in the first decoding process, five errors that have occurred in the 512-byte data sequence X1 are included two in the interleaved data sequence #4, one in the interleaved data sequence #5 and two in the interleaved data sequence #6. Although there are two errors in the check symbol sequence CS2, the number of errors in each interleaved data sequence does not exceed "5," all the interleaved data sequences can be corrected through a predetermined number of decoding processes and error correction will thus be completed.

According to this embodiment, as apparent from the above, the error correcting encoding process generates the encoded data sequence X4 obtained by affixing a plurality of check symbols CS1 and CS2, which are generated by different first and second data interleaving schemes, to the data sequence X1. For such encoded data sequence X4, error correction is carried out using either the check symbols CS1 or CS2 at the decoding time when a target interleaved data sequence is correctable. If the target interleaved data sequence is uncorrectable, this error correcting process repeats error correction until the interleaved data sequence is finally determined as uncorrectable. Even if errors which cannot be corrected with a single check symbol occur, it is possible to increase the probability of making the errors correctable.

Those errors which can be corrected with a single check symbol can be corrected fast and the decoding process can be finished quickly as per the conventional first encoding system. One possible case where it is finally determined that the interleaved data sequences are uncorrectable is that all of the three interleaved data sequences become uncorrectable in, for example, the second and subsequent decoding processes.

Second Embodiment

A second embodiment of this invention will now be discussed.

Figure 9:
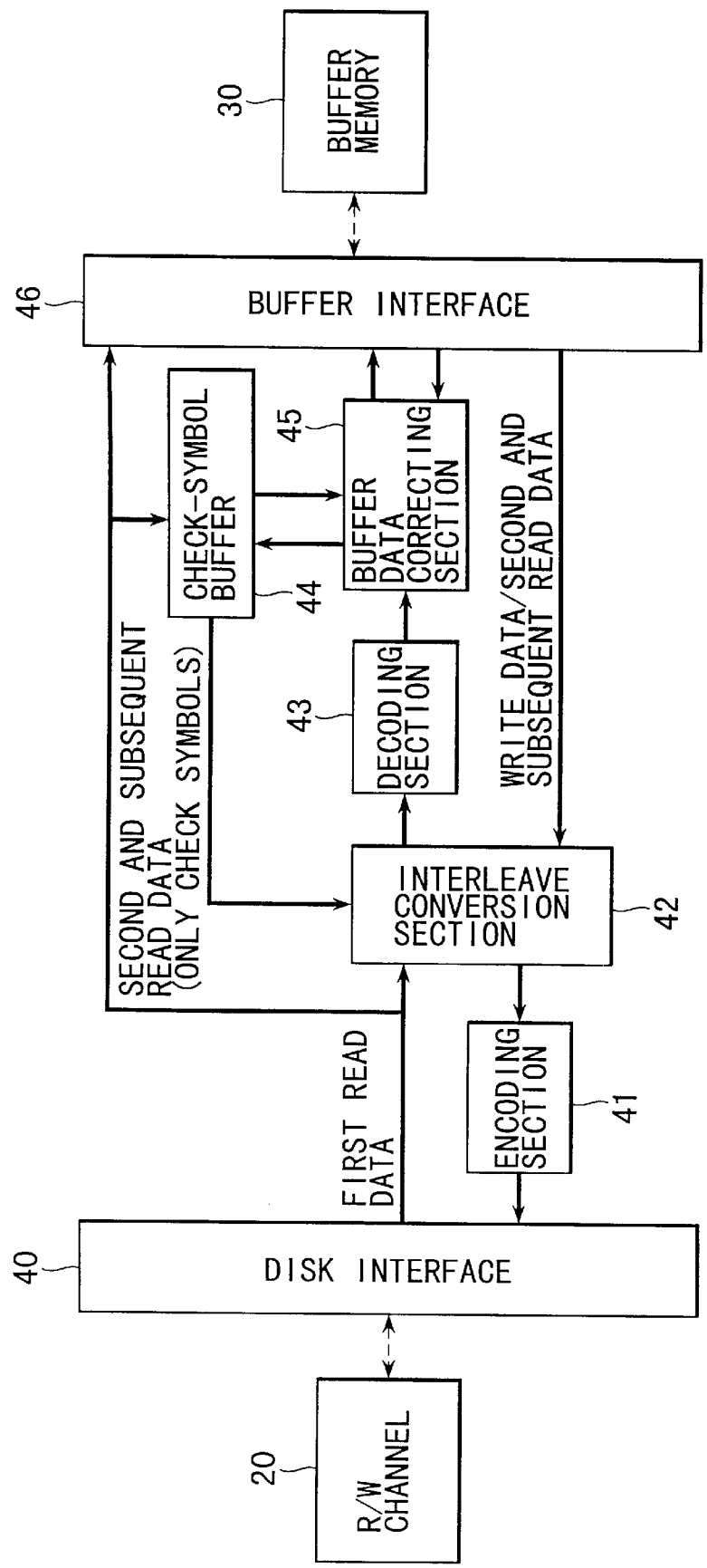
FIG. 9 is a block diagram showing the essential portions of an HDD according to a second embodiment of this invention.

The second embodiment is the above-described structure being adapted to an HDD. The structure and operation of this embodiment will be described below referring to FIG. 9.

An HDD has a signal processing circuit called a read/write (R/W) channel 20, and a disk controller (HDC) which performs data transfer between this R/W channel 20 and a buffer memory (sector buffer) 30. In the HDD, an encoding/decoding apparatus is provided in the HDC.

The HDC executes data transfer to the R/W channel 20 via a disk interface 40, and accesses the buffer memory 30 via a buffer interface 46. The encoding/decoding apparatus includes an encoding section 41, an interleave conversion section 42, a decoding section 43, a check-symbol buffer 44, and a buffer data correcting section 45.

The interleave conversion section 42 implements a data interleaving process on one sector of a data sequence as one block unit of the HDD (normally, an information block consists of 512 bytes) to generate three interleaved data sequences using the afore-mentioned first data interleaving scheme and second data interleaving scheme. The decoding section 43 decodes each interleaved data sequence according to a predetermined decoding algorithm and computes the values and positional information of errors contained in each interleaved data sequence. The buffer data correcting section 45 corrects read data stored in the buffer memory 30 (data transferred from the R/W channel 20) based on the decoding results from the decoding section 43 (the values and positional information of errors).

The encoding section 41 generates check symbols corresponding to the data sequence with an interleave structure that has been generated by the interleave conversion section 42. The check-symbol buffer 44, which is a temporary buffer exclusively for check symbols, may be provided in the buffer interface 46.

Write Operation

Write data (a data sequence to be recorded on a disk) transferred from a host system (personal computer) is stored in the buffer memory 30 in the HDD. In the HDC of this embodiment, the buffer interface 46 acquires the write data to be recorded on the disk, from the buffer memory 30 and sends the data to the interleave conversion section 42. The interleave conversion section 42 distributes the transferred data sequence to the interleaved data sequences #1 to #6 by the first data interleaving scheme and the second data interleaving scheme, and sends the distributed interleaved data sequences to the encoding section 41 (see FIGS. 3 and 4).

The encoding section 41 generates check symbols for each interleaved data sequence, generates an encoded data sequence to be actually recorded on the disk (the data sequence X4 in FIG. 5), and sends the encoded data sequence to the disk interface 40. The disk interface 40 sends the encoded data sequence (one sector of serial data) to the R/W channel 20. In the HDD, a write signal is supplied to a head via the R/W channel 20 and a head amplifier and the encoded data sequence is recorded on a designated track on the disk.

Read Operation

In a read operation, a read signal corresponding to the encoded data sequence recorded is read from the disk by the head, and is converted to digital read data by the R/W channel 20. When receiving the read data, the disk interface 40 saves it into the buffer memory 30 via the buffer interface 46. The data sequence X1 of 512 bytes corresponding to one sector is stored in the buffer memory 30. The check symbol sequences CS1 and CS2 are stored in the check-symbol buffer 44.

Thereafter, the above-described decoding process is carried out by the interleave conversion section 42 and the decoding section 43 (see FIGS. 8B and 8C). Specifically, the decoding section 43 decodes each interleaved data sequence, generated by the interleave conversion section 42, in accordance with a predetermined decoding algorithm, and computes the values and positional information of errors contained in each interleaved data sequence. The buffer data correcting section 45 corrects read data stored in the buffer memory 30 based on the decoding results from the decoding section 43 (the values and positional information of errors). For any error having occurred in a check symbol sequence, the values of corresponding data stored in the check-symbol buffer 44 is corrected too.

If there is any uncorrectable interleaved data sequence and it is determined that the decoding process should be continued, the data sequence X1 saved in the buffer memory 30 via the buffer interface 46 and the check symbols saved in the check-symbol buffer 44 are transferred to the interleave conversion section 42 and the decoding process is executed again.

As apparent from the above, the encoding/decoding method embodying this invention can be adapted to an HDD. This encoding/decoding method can therefore ensure fast error correction and enhance the probability of error correction, and is effective for an HDD with a high-recording density.

According to the structure of this embodiment, while one sector of data is transferred to the buffer memory 30 and the interleave conversion section 42 and is undergoing the decoding process, the next sector of data can be transferred to the buffer memory 30 and the interleave conversion section 42. With regard to a control section for which decoding can be completed with a single check symbol, an on-the-fly process can be carried out if the decoding time is shorter than the time needed to transfer one sector of data. When errors whose decoding cannot be completed with a single check symbol are detected, the fast on-the-fly decoding cannot be performed, but the probability of making errors correctable can be increased significantly by repeating the decoding process while changing the check symbols.

As specifically discussed above, this invention can provide an encoding/decoding method and apparatus, which can suppress reduction in the encoding efficiency by using a relatively small amount of error correcting codes and can implement fast error correction within the range of correctable errors per interleaved data sequence and can guarantee a capability of correcting errors beyond the range of correctable errors per interleaved data sequence. The method and apparatus of this invention, when adapted to a disk storage device like an HDD, can improve the error correcting capability without increasing the amount of ECCs so much, and are therefore very effective for a disk storage device which is designed to increase the recording density.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An encoding/decoding apparatus comprising:
    means for generating data sequences with different first and second interleave structures by respectively performing on a data sequence to be encoded, data interleaving processes based on different first and second data interleaving schemes;
    means for generating sequences of first and second error correcting codes respectively corresponding to said data sequences with said different first and second interleave structures;
    means for generating an encoded data sequence which has said generated sequences of first and second error correcting codes affixed to said data sequence to be encoded; and
    means for decoding a data sequence to be decoded, included in said encoded data sequence, by using said data interleaving processes and said sequences of first and second error correcting codes.

2. The encoding/decoding apparatus according to claim 1, wherein said data sequence with said first interleave structure is acquired by separating said data sequence to be encoded into groups of N pieces of data and distributing each group of N pieces of data to N sequences in a predetermined order; and
    said data sequence with said second interleave structure is acquired by separating said data sequence to be encoded into groups of N pieces of data and distributing each group of N pieces of data to N sequences using N! distributing ways in order.

3. The encoding/decoding apparatus according to claim 1, wherein said decoding means further comprises:
    means for reproducing a data sequence with said first interleave structure by performing on said data sequence to be decoded, a data interleaving process based on said first data interleaving scheme; and
    means for executing a first error correcting process on said reproduced data sequence with said first interleave structure, by using said sequence of first error correcting codes.

4. The encoding/decoding apparatus according to claim 3, wherein said decoding means further comprises:
    means for reproducing a data sequence with said second interleave structure by performing on said data sequence to be decoded, a data interleaving process based on said second data interleaving scheme; and
    means for executing a second error correcting process on said reproduced data sequence with said second interleave structure, by using said sequence of second error correcting codes.

5. The encoding/decoding apparatus according to claim 4, wherein said decoding means further comprises means for alternately performing said first error correcting process and said second error correcting process.

6. The encoding/decoding apparatus according to claim 1, further comprising:
   means for saving said data sequence to be decoded in a first buffer memory; and
   means for saving said sequences of first and second error correcting codes into a second buffer memory.

7. The encoding/decoding apparatus according to claim 6, wherein said decoding means further comprises:
   means for reflecting data and codes for which error correction has been successful in said error correcting processes, on said first and second buffer memories; and
   means for executing said error correcting processes again by referring to said first and second buffer memories.

8. A disk storage device comprising:
   means for generating data sequences with different first and second interleave structures by respectively performing on a data sequence to be written on a disk storage medium, data interleaving processes based on different first and second data interleaving schemes;
   means for generating sequences of first and second error correcting codes respectively corresponding to said data sequences with said different first and second interleave structures;
   means for generating an encoded data sequence which has said generated sequences of first and second error correcting codes affixed to said data sequence to be written on said disk storage medium;
   means for writing said generated, encoded data sequence on said disk storage medium;
   means for reading said encoded data sequence written on said disk storage medium; and
   means for decoding a data sequence to be transferred included in said read, encoded data sequence, by using said data interleaving processes and said sequences of first and second error correcting codes.

9. The disk storage device according to claim 8, wherein:
   said data sequence with said first interleave structure is acquired by separating said data sequence to be written into groups of N pieces of data and distributing each group of N pieces of data to N sequences in a predetermined order; and
   said data sequence with said second interleave structure is acquired by separating said data sequence to be written into groups of N pieces of data and distributing each group of N pieces of data to N sequences using N! distributing ways in order.

10. The disk storage device according to claim 8, wherein said decoding means further comprises:
    means for reproducing a data sequence with said first interleave structure by performing on said data sequence to be transferred, a data interleaving process based on said first data interleaving scheme; and
    means for executing a first error correcting process on said reproduced data sequence with said first interleave structure, by using said sequence of first error correcting codes.

11. The disk storage device according to claim 10, wherein said decoding means further comprises:
    means for reproducing a data sequence with said second interleave structure by performing on said data sequence to be transferred, a data interleaving process based on said second data interleaving scheme; and
    means for executing a second error correcting process on said reproduced data sequence with said second interleave structure, by using said sequence of second error correcting codes.

12. The disk storage device according to claim 11, wherein said decoding means further comprises means for alternately performing said first error correcting process and said second error correcting process.

13. The disk storage device according to claim 8, further comprising:
    means for saving said data sequence to be transferred in a first buffer memory; and
    means for saving said sequences of first and second error correcting codes into a second buffer memory.

14. The disk storage device according to claim 13, wherein said decoding means further comprises:
    means for reflecting data and codes for which error correction has been successful in said error correcting processes, on said first and second buffer memories; and
    means for executing said error correcting processes again by referring to said first and second buffer memories.

15. An encoding method comprising the steps of:
    generating data sequences with different first and second interleave structures by respectively performing on a data sequence to be encoded, data interleaving processes based on different first and second data interleaving schemes;
    generating sequences of first and second error correcting codes respectively corresponding to said data sequences with said different first and second interleave structures; and
    generating an encoded data sequence which has said generated sequences of first and second error correcting codes affixed to said data sequence to be encoded.

16. The encoding method according to claim 15, wherein:
    said data sequence with said first interleave structure is acquired by separating said data sequence to be encoded into groups of N pieces of data and distributing each group of N pieces of data to N sequences in a predetermined order; and
    said data sequence with said second interleave structure is acquired by separating said data sequence to be encoded into groups of N pieces of data and distributing each group of N pieces of data to N sequences using N! distributing ways in order.

17. A decoding method comprising the steps of:
    reproducing a data sequence with a first interleave structure by performing on a data sequence which is to be decoded and included in an encoded data sequence, a data interleaving process based on a first data interleaving scheme;
    executing a first error correcting process on said reproduced data sequence with said first interleave structure, by using a sequence of first error correcting codes included in said encoded data sequence;
    reproducing a data sequence with a second interleave structure, which is different from said first interleave structure, by performing on said data sequence to be decoded, a data interleaving process based on a second data interleaving scheme;
    executing a second error correcting process on said reproducing data sequence with said second interleave structure, by using a sequence of second error correcting codes included in said encoded data sequence; and alternately performing said first error correcting process and said second error correcting process.

18. The decoding method according to claim 17, further comprising the steps of:

saving said data sequence to be decoded in a first buffer memory; and saving said sequences of first and second error correcting codes into a second buffer memory.

19. The decoding method according to claim 18, further comprising the steps of:

reflecting data and codes for which error correction has been successful in said error correcting processes, on said first and second buffer memories; and executing said error correcting processes again by referring to said first and second buffer memories.

20. An encoding/decoding apparatus comprising:

a first generator configured to provide data sequences with different first and second interleave structures by respectively performing on a data sequence to be encoded, data interleaving processes based on different first and second data interleaving schemes;

a second generator configured to provide sequences of first and second error correcting codes respectively corresponding to said data sequences with said different first and second interleave structures;

a third generator configured to provide an encoded data sequence which has said generated sequences of first and second error correcting codes affixed to said data sequence to be encoded; and a decoder configured to decode a data sequence to be decoded, included in said encoded data sequence, by using said data interleaving processes and said sequences of first and second error correcting codes.

21. A disk storage device comprising:

a first generator configured to provide data sequences with different first and second interleave structures by respectively performing on a data sequence to be written on a disk storage medium, data interleaving processes based on different first and second data interleaving schemes;

a second generator configured to provide sequences of first and second error correcting codes respectively corresponding to said data sequences with said different first and second interleave structures;

a third generator configured to provide an encoded data sequence which has said generated sequences of first and second error correcting codes affixed to said data sequence to be written on said disk storage medium;

a write circuit configured to write said generated, encoded data sequence on said disk storage medium;

a read circuit configured to read said encoded data sequence written on said disk storage medium; and a decoder configured to decode a data sequence to be transferred included in said read, encoded data sequence, by using said data interleaving processes and said sequences of first and second error correcting codes.

* * * * *